United States Patent [19]

Kaplan

[11] 4,236,487

[45] Dec. 2, 1980

[54] CRYSTAL PLATING APPARATUS

[75] Inventor: Alan Kaplan, West Caldwell, N.J.

[73] Assignee: Emkay Manufacturing Company, East Hanover, N.J.

[21] Appl. No.: 34,780

[22] Filed: Apr. 30, 1979

[51] Int. Cl.³ .................. C23C 13/08; C23C 13/02
[52] U.S. Cl. .................................. 118/723; 427/10; 427/100
[58] Field of Search ............... 118/723; 427/10, 100

[56] References Cited

U.S. PATENT DOCUMENTS

| | | | |
|---|---|---|---|
| 2,765,765 | 10/1956 | Bigler et al. | 427/100 X |
| 3,756,851 | 9/1973 | Rennick et al. | 427/10 |
| 3,864,161 | 2/1975 | Thompson | 427/10 |
| 4,112,134 | 9/1978 | Buynak et al. | 427/10 |
| 4,112,147 | 9/1978 | Thompson | 427/10 X |

*Primary Examiner*—James R. Hoffman
*Attorney, Agent, or Firm*—Weingram & Klauber

[57] ABSTRACT

A crystal plating device and method thereof in which a crystal to be plated and thereby set at a desired frequency is placed in an external removable holder or slug for insertion into a chamber of a plating device. The device is connected to a vacuum pump which is activated after the slug is loaded. Spring loaded filament posts carry a filament of precious metal such as gold or silver. The crystal is oscillated at a predetermined frequency prior to the filament being energized to evaporate or atomize the metal which plates the crystal and sets its frequency identical to that of the oscillator.

The slug is externally loaded and can carry different size crystals. It is fitted with masks to accurately direct the deposit of the metal upon either or both sides of the crystal. After plating the slug is easily removed from the plating device.

14 Claims, 13 Drawing Figures

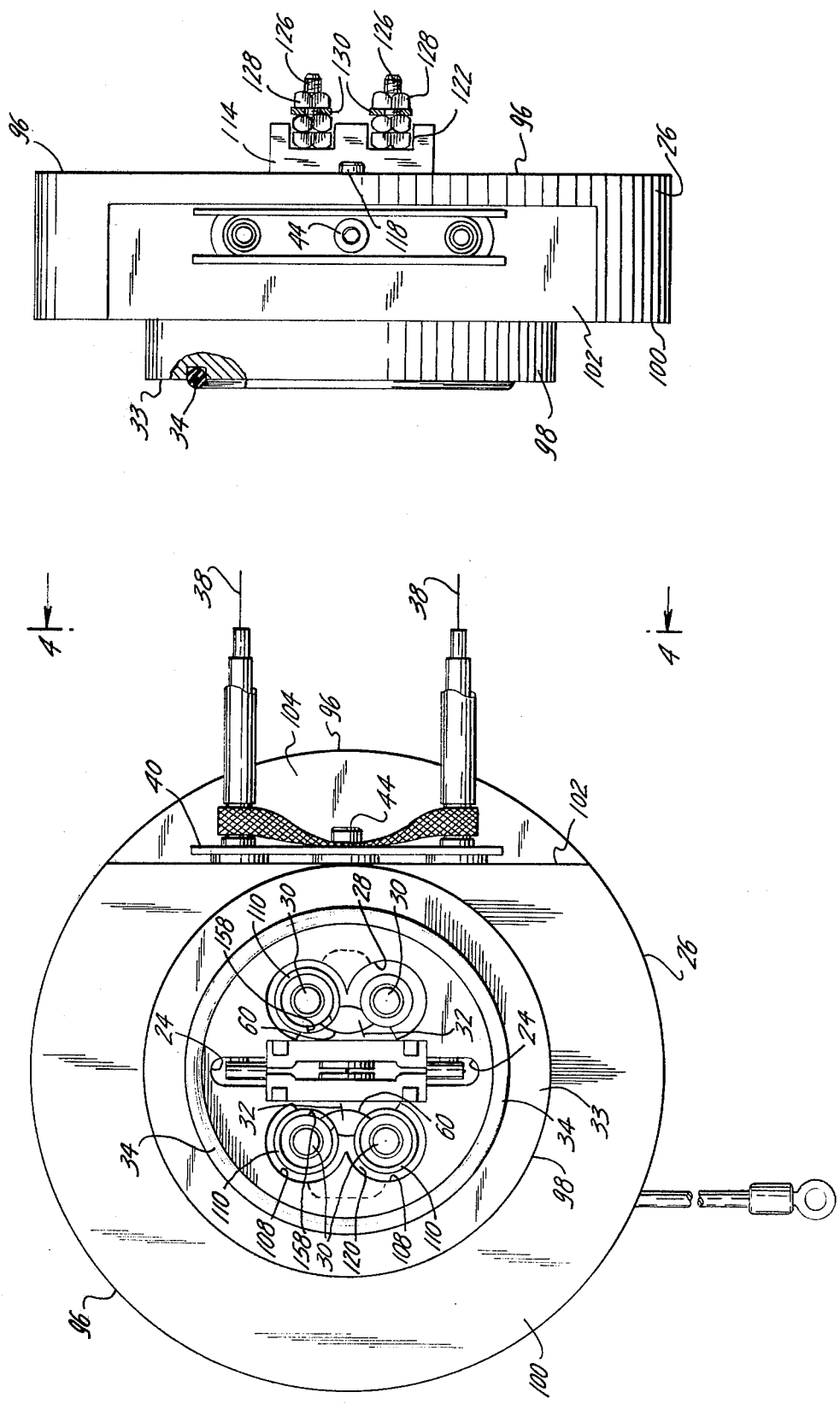

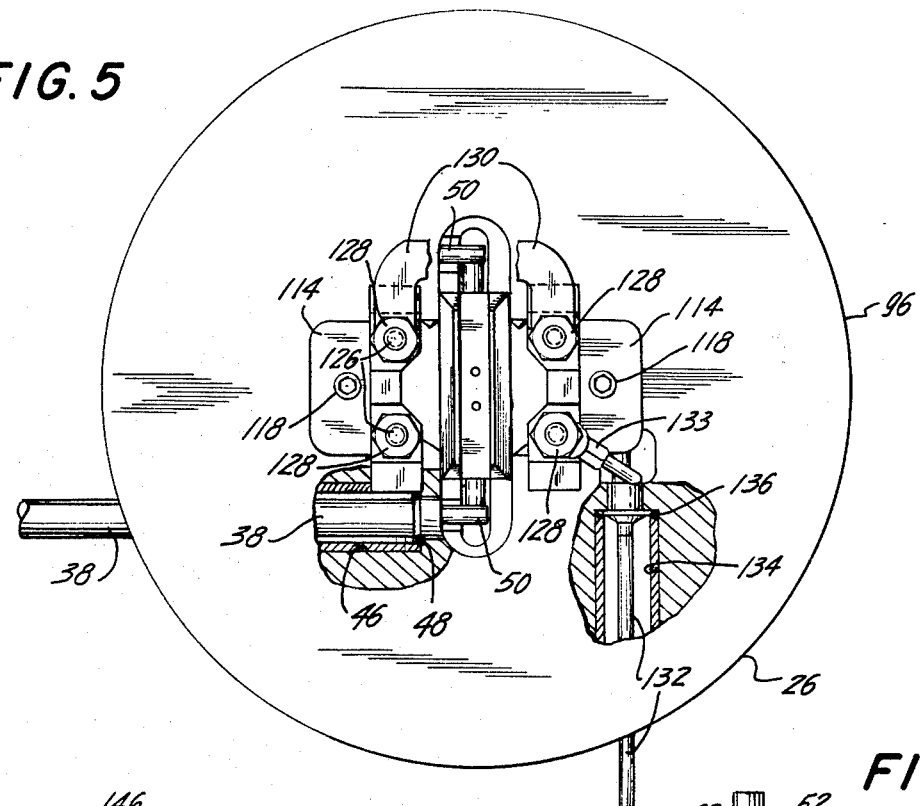
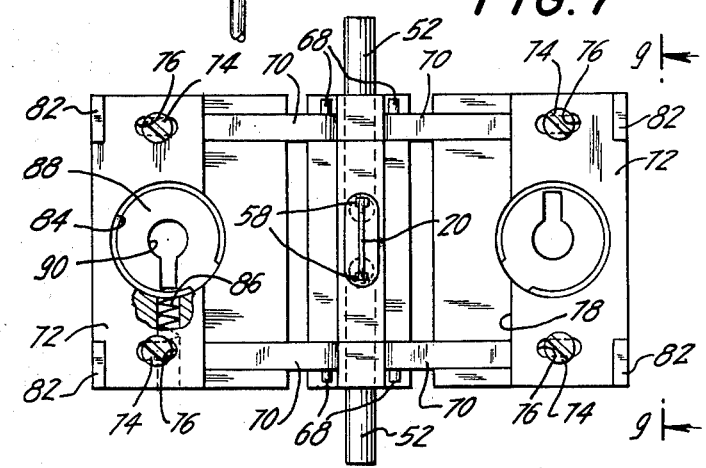
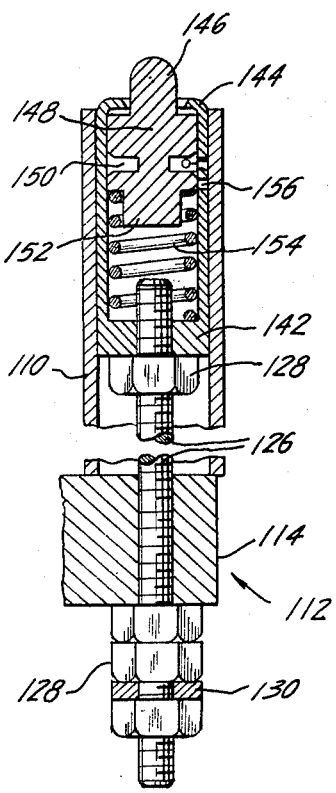
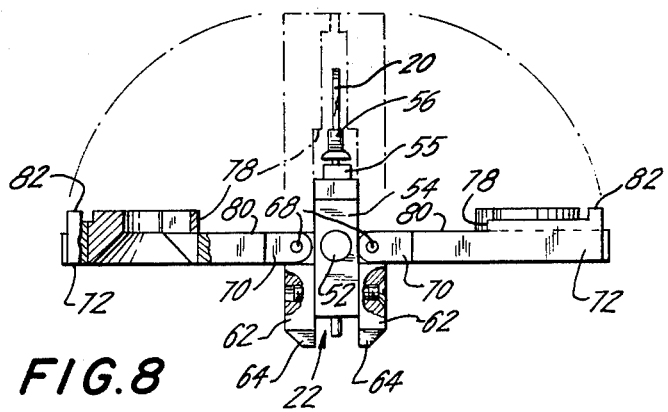

CRYSTAL PLATING APPARATUS

BACKGROUND OF THE INVENTION

1. Field of the Invention

The invention relates to plating of materials and more particularly to vacuum plating of crystals.

2. Description of the Prior Art

Crystals can be made to oscillate at a natural frequency, or by appropriate and selective plating can be manufactured to oscillate at a desired exact frequency. With the increased importance of electronics in our daily lives, crystals have gained widespread use in the circuitry for communications, and clocks and the like.

Depending upon how exacting the frequency is to be set the crystal may first be base plated, on one or both sides before being final coated, again on one or both sides. In the more accurate frequency work it is recommended to coat both sides of the crystal to avoid "spurs" which is the occurrence of random peaks caused by aberrations of unknown origin.

In the frequency range of the present invention the fundamental and overtones thereof have been tested up to 450 Mega Hertz and above, and have tested out with great accuracy of 2 ppm up to frequencies of at least 150 Mega Hertz.

In the prior art it was conventional practice to use a fixture carrying the crystal to be final plated and enclosed by a bell jar. Prior to plating the jar was evacuated. In this method the frequency accuracy was limited to 90 Mega Hertz, and even at this value test equipment showed the need to compensate to bring the frequency to within accepted levels.

Heretofore vacuum crystal plating was done in a bell jar in which the crystal had to be internally loaded with tweezers into a special holder within the bell jar. The entire bell jar then had to be evacuated, including the special holder for the crystal. The vacuum was then drawn thru a narrow opening and was not as absolute as desired. The relative size of the vacuum equipment, the complexly shaped items that were within the vacuum chamber provided multiple surfaces to which air or other contaminants could adhere. The presence of these contaminants, together with the difficulties in removing them results in deficienies in the plating process and resultant deficienies in the product produced.

Additionally, the internal loading of the crystals within the bell jar is relatively time consuming and therefore expensive. Also, because of the size and shape of the vacuum equipment, much of the noble metal vaporized in the plating process never reaches the crystals to be coated. Instead, it is randomly deposited on the walls of the bell jar or surfaces of the crystal holder. Therefore, the plating process is lengthened and much of the noble metal used in the plating process is ineffectively used.

The randomly deposited noble metal is recovered by cleaning the surfaces within the bell jar. However, because of the complexly shaped and relativly large surfaces the cleaning process is not as quick or easy as desired.

SUMMARY OF THE INVENTION

To overcome these problems, the present invention sets forth apparatus and method for plating crystals in a crystal plating device and method thereof in which a crystal to be plated and thereby set at a desired frequency is placed in an external removable holder or slug for insertion into a chamber of a plating device. The device is connected to a vacuum pump which is activated after the slug is loaded. Spring loaded filament posts carry a filament from which is hung a wire of precious metal such as gold or silver. The crystal is oscillated by means of a controllable external oscillator circuit while the filament is being energized to vaporize or atomize the precious metal. The particles of vaporized precious metal adhere to and plate the crystal, thereby setting the frequency of the crystal within a predetermined desired range.

The slug is externally loaded and can carry different size crystals. It is fitted with masks to accurately direct the deposit of the metal upon either or both sides of the crystal. After plating, the slug is easily removed from the plating device, and the plated crystal then removed from the slug.

Accordingly, it is an object of the present invention to provide a crystal plating device which reduces the vacuum pumping time; it is another object of the present invention to provide a crystal plating device which has a relatively small vacuum chamber.

Yet another object of the present invention is to provide a crystal plating device which enables alignment of the crystal to be plated to be made externally of the vacuum chamber.

A further object of the present invention is to provide a crystal plating device which does not require extensive alignment of the crystal within the vacuum chamber.

It is an additional object of the present invention to provide a crystal plating device which has relatively easy to clean internal surfaces within the vacuum chamber.

Another object of the present invention is to provide a crystal plating device which minimizes the amount of time required for loading of the chamber.

Still another object of the present invention is to provide a crystal plating device which facilitates effective use of the noble metal used in the plating process.

It is yet another object of the present invention to provide a crystal plating device which minimizes waste of the noble metal used in the plating process.

Another object of the present invention is to provide a crystal plating device which enables easy and rapid replace of filaments used for vaporizing the plating materials.

An additional object of the present invention is to provide a crystal plating device which is relatively reliable in use.

It is a further object of the present invention to provide a crystal plating device which can plate crystals of different size.

It is an additional object of the present invention to provide a crystal plating device which does not require modifications of the chamber to vary the size of the crystal being plated in the chamber.

Yet another object of the present invention is to provide a crystal plating device which can base plate and/or final cost crystals interchangably and/or as one sequence.

An additional object of the present is to provide a crystal plating device which can adjust he point at which plating occurs on three perpendicular axes.

It is another object of the present invention to provide a crystal plating device which can plate crystals on either or both sides.

It is also an object of the present invention to provide a method for plating crystals which minimizes the time required for plating the crystals.

Still another object of the present invention is to provide a method for plating crystals which minimizes the number of operations which must be performed within the vacuum chamber.

It is yet another object of the present invention to provide a method for plating crystals which enables alignment of the crystal intended for plating to be performed outside of the plating chamber.

Still another object of the present invention is to provide a method for plating crystals which enables alignment in three perpendicular axes of the crystal intended for plating.

It is an additional object of the present invention to provide a method for plating crystals which enables alignment of the crystal simply and without need for special tools.

A further object of the present invention is to provide a method for plating crystals which can plate crystals of different size without interrupting or disrupting the plating process.

It is an additional object of the present invention to provide a method for plating crystals which can plate either side or both sides of the crystal simultaneously.

Another object of the present invention is to provide a method for plating crystals which allows accurate adjustment and positioning on the crystal of the material to be deposited.

Other objects and advantages will be apparent from the following description of the invention; and the novel features will be particularly pointed out hereinafter in the claims.

BRIEF DISCRIPTION OF THE DRAWINGS

The invention is illustrated in the accompanying drawings in which:

FIG. 3 is a top plan view of the crystal device taken along line 3—3 of FIG. 2.

FIG. 4 is an upturned side view of the crystal device taken along line 4—4 of FIG. 3.

FIG. 5 is a bottom plan view of the crystal device taken along line 5—5 of FIG. 2.

FIG. 6 is a side elevational view, partly in section, of the spring biased filament post.

FIG. 7 is a top plan view of the crystal holder or slug in the open position as taken along line 7—7 of FIG. 8.

FIG. 8 is a side elevational view taken along line 8—8 of FIG. 7.

DESCRIPTION OF THE PREFERRED EMBODIMENTS

Figure 1:
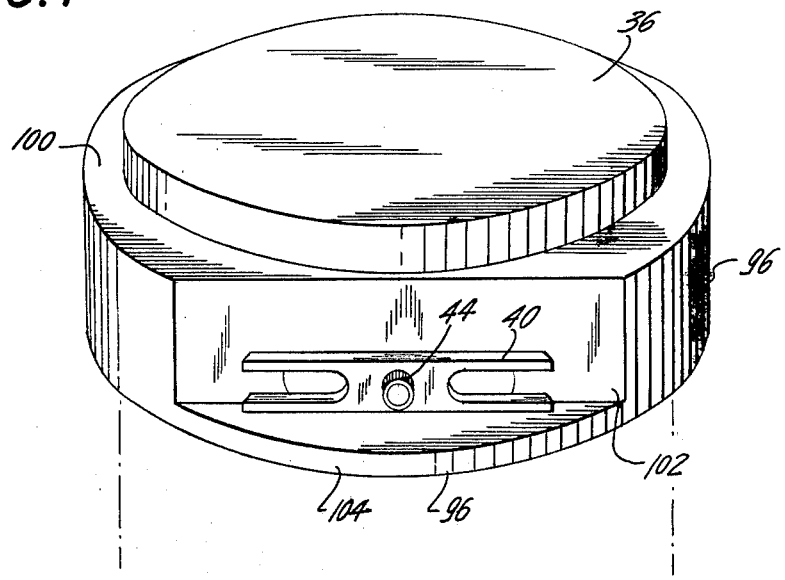
FIG. 1 is a side perspective view of the crystal device of the present invention.

The present invention as illustrated in FIGS. 1-12 teaches an improved crystal device and method thereof in which a crystal 20 is to be plated. In one embodiment the plating which brings the crystal to its desired frequency, commonly termed final plating is shown, and it is understood that the crystal blank can be base coated as desired in any suitable manner well known in the prior art. Another embodiment is shown in which the crystal can be base plated.

With reference to FIGS. 1, 2, 3, 9 and 12, the crystal 20 is plug connected within a crystal holder or slug 22 which when in its closed position is inserted into a slot 24 of a base 26 in communication with a chamber 28 in which is disposed two pairs of filament posts 30, one on each side of the crystal 20 and across which is mounted a filament 60 on which is hung a gold or silver wire 32. The base 26 is connected at the open bottom of the chamber 28 via the manifold in dotted lines, to a suitable vacuum pump (not shown) which may have a control valve. The top 33 of the base 26 has an annular "O" ring 34 which will seal against the top cover 36. The cover 36 has a rim which fits about the circular top 33 to snugly seal the top upon the vacuum within the chamber 28. The vacuum pumping time is reduced due to up to 80% less volume than prior art chambers and also the use of a wide mouth opening at the bottom of the chamber 28.

Two separate and independent electrical circuits are run within the base 26. The first circuit is made by a pair of shielded wires 28 having a common shield 40 which is grounded to the base 26 at the wire feed through retainer plate 42 connected to the base 26 by a fastener 44. Each wire 38, one of which is illustrated in FIG. 5 extends insulatingly through a metal tube fitted within a counterbore 46 within the base and sealed by and "O"-ring 48. The inner end of each wire 38 connects to a lead pin 50 which extends partially into the slot 24 near its bottom.

A contact pin 52 is disposed in each end of an insulated block 54 of the slug. Each pin 52 contacts a receptacle tube 55 extending upward through the insulating block 54. A lead 58 from the crystal is fitted into the passage in each receptacle tube. Each crystal lead 58 is connected to a spring loaded receptacle 56 connected by conductive epoxy to one side of the crystal 20. The other lead 58 is connected to the other side of the crystal and is received in a second receptacle tube 55 which is contacted within the block 54 by a second pin 52 extending externally from the opposite side of the block 54.

Once the crystal 20 is mounted within the receptacle tubes 55, 55 via its leads 58, 58 a series circuit will be formed running from one wire 38, to pin 50, pin 52, receptacle tube 55, lead 58, spring receptacle 56, crystal 20 and then out the other side wherein the components appear in reverse order.

The wires 38, 38 are connected to a frequency oscillator (not shown) which incorporates the crystal 20. The oscillator with the crystal is connected to a frequency counter which monitors the changes in frequency as the plating process proceeds. It will be understood that any conventional oscillation circuit and oscillator can be used in order to achieve the improvements of the present invention, and therefore no specific details thereof have been set forth herein.

Figure 12:
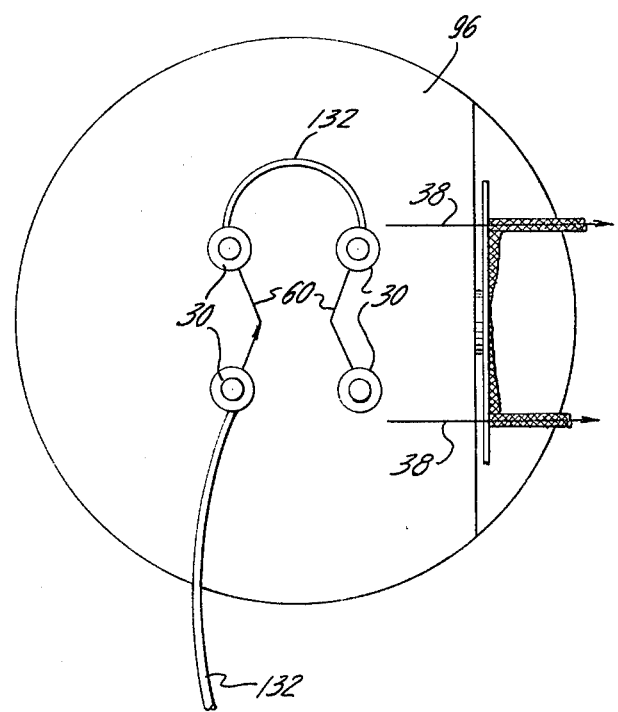
FIG. 12 is a schematic representation of the crystal oscillating circuit and the filament circuit showing the filaments mounted across adjacent pairs of filament posts.

The power circuit is connected to a suitable power supply (not shown) wherein conductive filaments 60 are attached as shown in FIGS. 3 and 12 across adjacent filament posts 30, as more fully described hereinafter and the posts 30 are connected in series, with the last (4th) post 30 grounded to the base 26 to complete the power circuit. Upon energizing the power circuit a current of approximately 30 amps and 1 volt will pass through the circuit and the filaments 60 so as to vaporize the silver (or gold) wire 32 which are positioned on the filaments 60 which being adjacent to the crystal 20 will be directed through the masks 62 mounted in the holder 22 to be deposited upon one or the other of the sides of the crystal 20 so as to plate the crystal. Because the current is high and the voltage low the only things that gets hot are the filaments 60, and the wires of silver hanging on the filaments. The filament posts 30 of which three of the four are insulated from the base 26 are of much larger mass than that of the filaments 60, and will act as heat sinks so as to greatly reduce cycle time.

Figure 9:
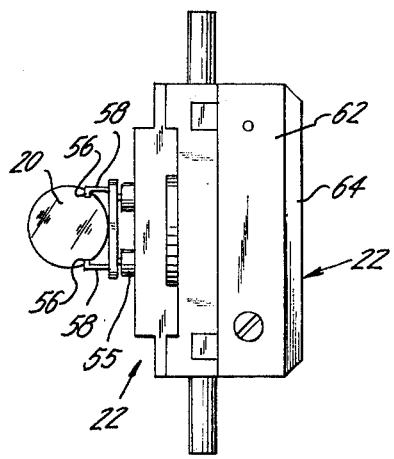
FIG. 9 is a front elevational view taken along line 9—9 of FIG. 7.
Figure 9A:
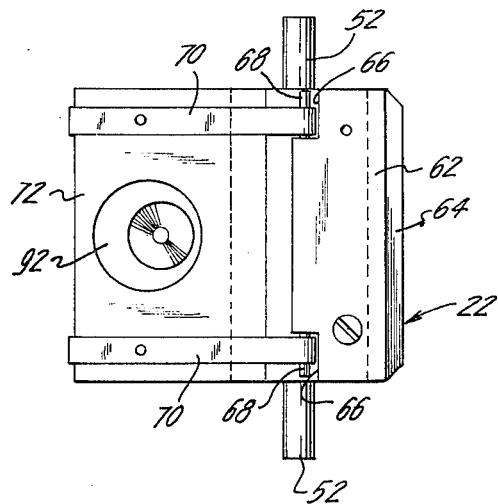
FIG. 9A is a front elevational view of FIG. 9 wherein the pivoted mask holders are shown in raised posistion.

The crystal holder assembly or slug 22 is illustrated in FIGS. 7, 8 and 9 wherein the insulated block 54 has insert guides 62 connected along its length on opposite sides thereof. The lower edge 64 is leveled at the external bottom edge to aid insertion of the slug within the base slot 24, and has corner cut outs 66 at each upper corner edges, as is shown in FIG. 9A. Hinge pins 68 extend parallel to the insulator block 54 from the vertical face of the cut outs 66 to pivotally receive hinge supports 70 which are square rod which are fitted with slotted mask holders 72 which are adjustably connected to the supports 70 by screws 74 to slide within the mounting slots 76 between a retracted position for small size crystals 20 and an extended position for larger size crystals 20.

The holder has a longitudinal shoulder 78 which ends the lower step 80 formed to permit the mask holders 72 to be raised vertically without interfering with the insulated block 54, as illustrated by the dotted line representation of FIG. 8. Aligned inwardly facing flanges 82 act as stops to prevent overswinging of the mask holders 72 and contacting of the crystal 20 or abutment of the screws 74. An aperture 84 circularly sloped with a longitudinal bore formed on one side as shown in FIG. 7 to receive a retaining spring 86 which holds a circular mask 88 therein. The mask 88 has a flared down keyhole nozzle 90 which will direct the evaporated silver toward the crystal 20.

Figure 10:
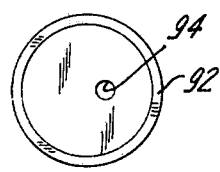
FIG. 10 is a top plan view of one of the final calibration masks.
Figure 11:
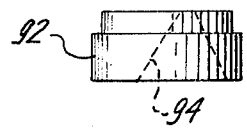
FIG. 11 is a side elevational view of the mask of FIG. 10.

An alternate mask 92 is shown in FIGS. 10 and 11 wherein a tapered nozzle 94 is eccentrically formed to permit adjustment thereof to align the mask nozzle 94 relative the crystal 20. It will be understood that the mask 88 can be used for base plating, while the mask 92 can be used for final plating.

The crystal 20 will be connected within the receptacle tube 55 to place the crystal 20 in the oscillating circuit. The hinged mask holder 72 will be in the open position shown by the solid lines of FIG. 8 and 7 and 9. Thereafter the holders 72 will be raised vertically to present a narrow profile shown by the dotted lines of FIG. 8 and in FIG. 9A for insertion within the slots 24 of the base 26 as shown in FIGS. 3 and 5. The contact pins 52 will electrically engage the lead pins 50 so that when the oscillator is activated the circuit will be completed and the crystal will oscillate to enable the plating process to procede.

The base 26 has a circular lower diameter 96 which is reduced to a smaller upper diameter 98 by an annular step back at 100, while the side adjacent the lead retainer 42 has a slabbed step 102 which extends from a tangent of the upper circle downwardly along a straight wall which terminates in a narrow horizontal platform 104 that extends to the full diameter 96 and extends underneath the leads 38. The slabbed step 102 permits the leads 38 to be shortened and thereby keep the capacitance to a very low value thus increasing the accuracy of the oscillator circuit to the crystal 20 and eliminating the need to compensate for the frequency setting.

The slot 24 is formed in chamber 28 along a line parallel to the slabbed step 102. Inwardly from the ends of slot 24 and on opposite facing sides thereof are two pairs of cloverleaf apertures 108, three of which are sized to receive an insulating sleeve 110 which fits about the filament holders 70 and insulates it from the base 26. The forth filament holder 30 is slidingly disposed within a smaller diameter opening to be grounded to the base 26.

The chamber 28 extends top to bottom of the base 26 and includes the clover leaf apertures 108 in communication with the slots 24.

Figure 2:
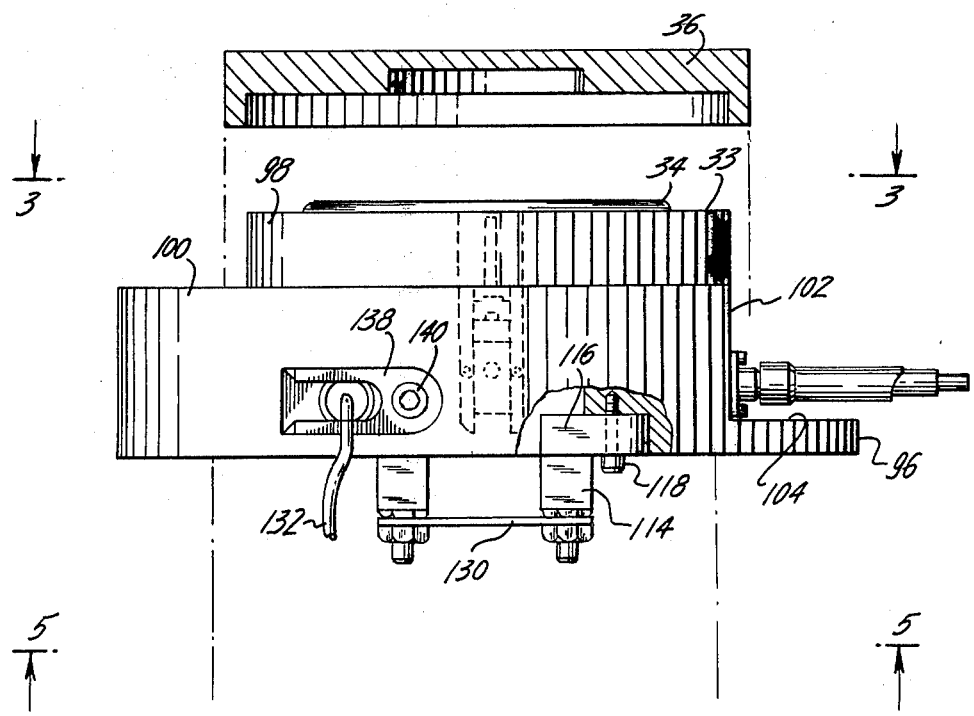
FIG. 2 is a side elevational view of the crystal device of the present invention.

The filament post 30 is part of a filament post assembly 112 which includes the insulating sleeve 110 and the filament 60, and and insulated filament post holder 114 having a horizontal mounting flange 116 through which a mounting screw 118 passes to be threadedly received in a tapped hole in the base 26 as shown in FIGS. 2, 4, and 5. There is one holder 114 for each pair of posts 30. The inner surface 120 between the posts 30 is hogged out of the chamber 28 in a contour to aid vacuum excavation.

The holder 114 has two bottom recesses 122 illustrated is FIG. 4 and vertical holes 124 central thereto through which threaded members 126 extend to receive a pair of nuts 128 and a connecting strip 130 which extends between the three posts 30 which have the insulated sleeves 110 and is held upon the members 126 by a third nut 128 as shown in FIG. 5.

The first of the posts 30 is connected to an internal power supply lead 133 which is in turn connected to an external power supply lead 132 that extends through a metal sleeve 134 and is insulated therefrom, while the sleeve is sealed at its inner end by an "O" ring 136 to prevent an air leak into the vacuum chamber 28. A retainer 138 having a bifurcated end positions the wire 132 within the sleeve 134 and sealingly holds the sleeve 134 within the feed through bore of the base 26, with the retainer 138 being held in position by a threaded fastener 140. (See FIG. 2).

The filament post 30 illustrated in FIG. 6 with a tapped hole through which the threaded member 126 and will be screwed down to rest upon an internal nut 129 which sets the posts 30 height. The body 142 is hollow with an inturned annular flange 144 at its upper end through which a fastener button 146 extends to trap the fastener 148 within the body 142. The fastener has an annular radial slot 150 below which the fastener has a reduced diameter so that the spring retainer 152 to engage the upper end of a coil spring 154 the lower end of which rests upon the bottom of the body 142 and is disposed about the threaded member 126.

The spring 144 will normally urge the fastener 148 upwardly so that the slot 150 is raised above a pair of diametrically opposite body slots 156. The tension of the spring 154 can be set by adjusting the body 142 upon the member 126 with internal 129. The height of the body 142 can be adjustably set by raising or lowering the external nuts 128 and then bring the body 142 to rest thereupon.

The insulated sleeve 110 has a cut out 158 which uncovers the body slots 156 of adjacent facing filament posts 30 as shown in FIG. 3 so that whenever a filament 60 is to be connected the operator will depress the button 146 to align the slot 150 of the fastener 148 with the body slot 156 so that the end of a filament 60 can be inserted therein. Releasing the button 146 allows the spring 154 to force the fastener 148 upwardly to entrap the filament 60 end within the fastener 148 and securely wedge it between the now nonaligned slots 150 and 156. Thus the delicate silver wire filaments 60 is easily and securely fastened between the adjacent pairs of posts 30. The height of the post 30 has been set to correspond to the crystal 20 size and the opening 94 of the mask 92.

The power circuit shown in FIGS. 3, 5 and 12 shows the power lead 132 which is connected to a suitable source of power making a circuit from post 30 (or strip 130) to filament 60, to post 30, to strip 130, to post 30, to filament 60, to uninsulated post 30 which is grounded to the base 26 so as to complete the circuit. When the power source is energized, after the slug 54 is assembled within the base 26, and the vacuum established in the chamber 28, the electrical energy will heat the filaments 60 and cause the silver to be vaporized and the nozzle 94 of the mask 92 will direct the silver to be deposited upon the oscillating crystal 20 controlled by the oscillating circuit described hereinbefore.

It should be noted that alternative power circuits to the filament heads are also possible. For example, the pairs of filament posts can be connected in parallel, or can be provided with separate external power supplies.

SUMMARY OF METHOD AND DISCUSSION OF ADVANTAGES

Operation

Prior to performing plating operations, the chamber is thoroughly clean. This is easily accomplished by disconnecting internal power supply lead 133, unfastening mounting screws 118 and removing the pairs of filament posts 30. The chamber can then be easily cleaned by any convenient cleaning implement such as a toothbrush. The individual filament posts can be disassembled down to the main components and similarly cleaned.

After cleaning, the apparatus is reassembled and connected to the power supply and the oscillator. Filaments are placed within and connecting adjacent filament holders to complete the electrical circuit. A strand of silver or gold (depending on which is desired) is then placed on the filament on the side of the crystal where plating is desired, or on both filaments if plating is desired on both sides.

The chamber is then connected to an appropriate source of vacuum, normally by placing the chamber on top a vacuum manifold so that the vacuum can be drawn from the bottom of the chamber.

A crystal to be placed is mounted in a slug in preparation for plating. Depending on whether base plating or final plating is to be conducted, an appropriate plating mask is placed in the mask holder of the slug.

Wide ranges of crystal size can be accommodated in the chamber by using crystal holders which are sized to compensate for the different dimensions of the crystals and still bring the crystals into proper location for plating. Any size variation that can't be accomodated by means of different size crystal holders or slugs may be accomodated by adjustment of the height of the filament holders.

One or more crystal holders or slugs can be used in the plating process. Preferably several slugs will be used to insure that the vacuum chamber will not be idle while crystal are being mounted in slugs for plating.

The arms of the slug or crystal holder are placed in the upright position bringing the mask into operative association with the face of crystal. The masks are manipulated to the position that will deposit the material in the desired location on the crystal.

By rotating the mask, it is possible to adjust the horizontal and/or vertical position of the eccentrically positioned orifice in the mask with respect to the face of the crystal. Also, the mask may be positioned vertically within the mask holder and will be held in position by means of spring 86. Additionally, spring 86 will hold the position of the mask in the plane perpendicular to the face of the crystal, so that this position can be set by merely pushing the mask with the fingers towards or away from the face of the crystal. The position of the mask perpendicular to the plane of the crystal face is important to control and minimize the dispersion of the atomized or vaporized metal that has passed through the orifice prior to adhering to the face of the crystal.

The crystal holder or slug is then placed in slot 24 of chamber 28 so that the contact pin 52 of the slug will make electrical contact with the lead pin 50 from the oscillator lead.

The cover of the chamber is then put in place and seals automatically as the vacuum is drawn from the bottom of the container.

Power is provided to oscillator to which the crystal in the slug is connected and incorporated. The frequency of oscillator is accurately measured by a frequency meter to which the oscillator is connected. Plating of the crystal can be started once the crystal begins oscillating. Plating is commenced by connecting the power supply to the filament by an appropriate switch which has not been shown. The heat in the filament combined with the vacuum in the chamber vaporizes the strand of silver hanging on the filament. As the vaporization proceeds, particles of the vaporized material are deposited and condensed on the unmasked portion of the crystal. The frequency of the crystal will change as the build-up of condensed material continues on the crystal.

When the frequency counter indicates that the crystal frequency has reached the desired value, the power to the filaments is discontinued. Because of the relatively small size of the filaments as compared to the filament holder, the heat will be rapidly drawn away from the filaments cooling them sufficiently to quickly end vaporization of the plating material.

After plating has been completed the vacuum is released and the slug or crystal holder is removed and another inserted for the next plating operation.

The strands of plating material are easily positioned for plating by merely placing them to hang from the filament. After repeated plating operations, the filaments themselves will deteriorate. However, the are easily replaced by merely depressing the fastener button 146 to remove the old filament and replace it with a new filament.

It should be noted that the the interchangeability of masks and/or slugs allows for the plating of different size crystals in the same chamber without modifying the chamber in any way to accommodate the different size crystals.

Also, because the different masks can be used interchangeably, it is convenient to separately perform either base coating and/or final calibration coating procedures in the same chamber. Further, if desired, because of the superior qualities of this apparatus, it is possible to conduct both the base and final calibration procedures during a single operation in the apparatus. This single or "one step" procedure is used when the final product does not require intermediate processing steps often employed to insure compliance with more stringent crystal performance specifications.

From the above discussion it is clear that there are many advantages of the present apparatus. For example, the vacuum chamber 28 is of relatively small volume and is relatively uncomplicated in shape. Therefore, it can be evacuated quickly and offers relatively few shapes or areas in which pockets of gas tend to adhere or resist evacuation. By using removable crystal holders or slugs to mount the crystal, all crystal adjustment can be made at places remote from the vacuum chamber where there is adequate working room and where the process of adjusting the crystal in the holder will not interfere with the plating operation. After the plating has produced a build-up of the plating material on the walls of the chamber, the unused plating material can easily be recaptured by the ease of cleaning the plating chamber.

The relative small volume of the vacuum chamber combined with the use of the slugs to hold and adjust the crystals prior to plating insures that the actual cycle time for performing the plating in each of the crystals is relatively short. Additionally, almost all of the valuable plating material can be recaptured without difficulty by the simple cleaning process mentioned previously.

It will be understood that the various changes in the details, materials, arrangements of parts and operating conditions which have been herein described and illustrated in order to explain the nature of the invention, may be made by those skilled in the art, within the principles and scope of the invention.

What is claimed is:
1. A crystal plating device comprising:
   (a) a base having a power circuit and an oscillating circuit therein;
   (b) a chamber formed in the base;
   (c) a sealed top enclosing the chamber;
   (d) at least one pair of filament posts affixed to the base disposed within the chamber and in the power circuit;
   (e) a filament connected across the filament posts;
   (f) a crystal holder removably connected with the base;
   (g) a crystal in the oscillating circuit and carried by the crystal holder; and
   (h) a pump connected to the base to vacuum pump the chamber whereby energizing the circuits will oscillate the crystal and evaporate the filament to plate the crystal and produce the desired frequency therefor.
2. The combination claimed in claim 1 wherein:
   (a) the base has a generally curved outer surface configuration; and
   (b) a portion of said outer surface is relatively flat to shorten the leads of the oscillation circuit so that capacitance thereof is reduced.
3. The combination claimed in claim 1 wherein:
   (a) the filament posts include an insulating sleeve having a cut out in the area of the filament.
4. The combination claimed in claim 3 wherein:
   (a) the filament posts are formed in two pairs;
   (b) insulating sleeves are fitted for at least two of the four filament posts; and
   (c) the filament posts other than those having insulating sleeves being grounded to the base to complete the power circuit.
5. The combination claimed in claim 3 wherein:
   (a) the filament posts are threadedly received on vertical members whereby the height thereof is adjustable.
6. The combination claimed in claim 5 wherein:
   (a) the filament posts each have a body threadedly received on the member;
   (b) the body is hollow and has a slotted button biased upwardly by a coil spring entrapped therein;
   (c) a slot formed in the body inwardly of the upper end;
   (d) the filament disposed within the body slot whereby depressing the button slot will align the button slot and engage the filament therein to be clamped upon release of the button.
7. The combination claimed in claim 5 wherein:
   (a) retainers are connected to the base to permit the leads to enter the sleeves and to prevent the sleeves from leaving the slots.
8. The combination claimed in claim 1 wherein:
   (a) each of the circuit leads enters the base;
   (b) slots are formed in the base to receive the leads;
   (c) feed through sleeves are fitted within the slots; and
   (d) "O" rings are externally connected to said sleeves to seal the same from the chamber and prevent atmosphere from leaking into the vacuum chamber.
9. The combination claimed in claim 1 wherein:
   (a) the crystal holder has an insulated body;
   (b) crystal contacts are disposed in the insulated body; and
   (c) the crystal is mounted in the insulated body in circuit with the contacts.
10. The combination claimed in claim 9 wherein said crystal holder comprises:
   (a) a pair of hinge plates connected to the insulated body;
   (b) a pair of mask holders pivotally connected to the hinge plates;
   (c) a central aperture found in each of the mask holders; and
   (d) an aperture mask disposed in the aperture.
11. The combination claimed in claim 10 wherein:
   (a) a pair of pivot arms are formed on each of the mask holders to adjustably position the mask holder in an inner or an outer or an intermediate position; and
   (b) the mask holder height is set to correspond to the height and size of the crystal.
12. The combination claimed in claim 11 wherein;
   (a) the apertured mask is cirular in form; and
   (b) the aperture of the mask is formed eccentrically.
13. The combination claimed in claim 11 wherein:
   (a) the aperture of the mask defines a keyhole opening which tapers toward the crystal to produce a nozzle effect.
14. The combination claimed in claim 10 wherein:
   (a) the aperture is formed to taper inwardly toward the crystal to produce a nozzle effect.

* * * * *